United States Patent [19]
Lee et al.

[11] Patent Number: 5,157,573
[45] Date of Patent: Oct. 20, 1992

[54] ESD PROTECTION CIRCUIT WITH SEGMENTED BUFFER TRANSISTOR

[75] Inventors: Kwok Fai V. Lee; Alan Lee, both of Irvine, Calif.

[73] Assignee: Western Digital Corporation, Irvine, Calif.

[21] Appl. No.: 648,577

[22] Filed: Jan. 31, 1991

Related U.S. Application Data

[63] Continuation-in-part of Ser. No. 351,670, May 12, 1989, Pat. No. 5,051,860.

[51] Int. Cl.$^5$ .............................................. H02H 9/04
[52] U.S. Cl. ...................................... 361/56; 361/58; 361/91; 361/111
[58] Field of Search .................... 361/58, 56, 91, 111; 357/23.13

[56] References Cited

U.S. PATENT DOCUMENTS

| | | | |
|---|---|---|---|
| 4,086,642 | 4/1978 | Yoshida et al. | 361/91 |
| 4,605,980 | 8/1986 | Hartranft et al. | 361/56 |

OTHER PUBLICATIONS

Chen et al., "The Effect of Channel Hot Carrier Stressing on Gate Oxide Integrity in MOSFET", Proc. Int'l Reliability Physics Symposium, 1988.

Khurana et al., "ESD on CHMOS Devices—Equivalent Circuits, Physical Models and Failure Mechanisms", Proc. Int'l. Reliability Physics Symposium, 1985.

Duvvury et al., "ESD Protection Reliability in 1 Micrometer CMOS Technologies", Proc. Int'l Reliability Physics Symposium 1986.

Weste et al., *Principles of CMOS VLSI Design*, Addison-Wesley Publishing Company, pp. 224–231.

Fujishin et al., "Optimized ESD Protection Circuits for High-Speed MOS/VLSI", Proc. Custom Integrated Circuits Conference May, 1984, pp. 569–573.

Ochoa et al., "Snap-Back: A Stable Regenerative Breakdown Mode of MOS Devices", IEEE Transactions on Nuclear Science, vol. NS-30, No. 6, Dec., 1983, pp. 4127–4130.

Avery, "Using SCR's As Transient Protection Structures in Integrated Circuits", RCA DSRC, Princeton, N.J., pp. 177–180.

*Primary Examiner*—Todd E. DeBoer
*Attorney, Agent, or Firm*—Spensley Horn Jubas & Lubitz

[57] ABSTRACT

An electrostatic discharge protection circuit for an integrated circuit employing a segmented field effect buffer transistor between the input/output pad and the active devices on the integrated cicuit. An extended resistive structure is configured in series with the segmented buffer transistor and the input/output electrical contact pad. The extended resistive structure is integrally formed with the individual segments of the buffer FET. The resistive structure may be implemented as an extended n well structure adjacent the FET segments. In a first resistance mode during normal circuit operations, the extended resistive structure has a low resistance value and introduces virtually no additional load to the input/output buffer circuitry. In a second mode of operation during ESD discharge, the resistive structure has a second significantly higher resistance which reduces current values during the ESD event thereby protecting the buffer circuit. A thick oxide snap-back device is also employed to provide a parallel EDS discharge path with low power dissipation.

18 Claims, 8 Drawing Sheets

ESD PROTECTION CIRCUIT WITH SEGMENTED BUFFER TRANSISTOR

RELATED APPLICATION INFORMATION

This application is a continuation-in-part of U.S. patent application Ser. No. 07/351,670 filed May 12, 1989, now U.S. Pat. No. 5,051, 860.

BACKGROUND OF THE INVENTION

1. Field of the Invention

The present invention relates to solid state devices of the type employing a large number of semiconductor devices on an integrated circuit chip. More particularly, the present invention relates to buffer circuits for protecting such semiconductor devices from damaging pulses originating on integrated circuit chip input/output pads.

2. Description of The Prior Art and Related Information

Electrostatic discharge (ESD) is an increasingly significant problem in integrated circuit design. Such potentially destructive electrostatic pulses are due to various transient sources such as human or machine handling of the integrated circuit chip during processing, assembly and installation of the chip. Such ESD events will typically originate at one or more of the integrated circuit electrical contact pads with the specific discharge path varying with the integrated circuit design and the size and polarity of the electrostatic charge applied to the pad. Increased device packing densities and diminished device geometries in modern VLSI chips have generally increased the susceptibility to damage from ESD pulses.

Having effective on-chip protection against ESD is very important because elaborate and expensive environmental controls can then be avoided when the integrated circuit is being handled by human operators and assembly machines. Also, for applications where the chip is unavoidably positioned adjacent sources of electrostatic buildup or high voltage rails such on-chip protection is the only type of protection against ESD available. Since the first circuitry electrically connected to the integrated circuit pads is normally some type of input/output buffer circuit, it is such circuitry which must bear the brunt of the ESD problem. Such input/output buffer circuitry serves to buffer the logic devices on the integrated circuit, which typically operate at relatively low voltage and current levels, from the voltage and current levels on the input/output pad which interfaces with external devices. In the case of a typical CMOS (Complementary Metal Oxide Semiconductor) integrated circuit design, the CMOS devices in the integrated circuit will typically be buffered from the input/output pads by one or more CMOS inverters having wide Field Effect Transistors (FETs) which serve to buffer the internal logic gates from the input/output pad. Therefore, in a typical ESD event, a high voltage applied to an input/output pad would cause a high ESD discharge current to flow through one of the legs of the CMOS inverter gate to $V_{dd}$ or $V_{ss}$, respectively. One type of discharge path may occur from the output pad through the n channel FET through to $V_{ss}$. Depending upon the polarity of the ESD voltage pulse supplied to the pad, the discharge may either proceed via an avalanche breakdown of the drain/channel junction of the n channel FET or via a forward biasing of the drain/channel diode. The avalanche breakdown type of discharge path is the most destructive since it is most likely to result in the irreversible damage to the structure of the n channel FET.

In FIG. 1, a prior art approach to protection of an integrated circuit from ESD events is illustrated schematically for a simple CMOS inverter buffer circuit coupled to an integrated circuit output pad. As shown in FIG. 1, a diffusion resistor is positioned in series with the output pad and the buffer inverter. Such diffusion resistor will typically be an n or p type diffusion into the substrate of the integrated circuit having a sufficiently high resistance value such that upon occurrence of an ESD event, the discharge current through the p FET or n FET of the inverter will be reduced to an acceptable value. Since the resistor is formed as a diffusion into the substrate, the diffusion resistor also provides an alternate current path for the discharge current into the substrate, which is typically coupled to $V_{ss}$. For this reason, the diffusion resistor is also schematically indicated with a diode symbol in FIG. 1 to illustrate the diode type contact between the diffusion and the substrate which provides this alternate current path. Although the ESD protection circuit of FIG. 1 has proven acceptable for some applications, modern IC design constraints have rendered such ESD protection inadequate for many applications.

More specifically, ongoing modifications to integrated circuit designs have increased the susceptibility of modern VLSI integrated circuits to ESD damage. For example, one of many desirable design characteristics for a CMOS integrated circuit is the ability to conduct a large amount of current. In order to achieve this design goal, the physical structure of a CMOS integrated circuit must undergo various modifications. Two of the most useful have been a reduction in the thickness of the gate oxide underneath the gate electrode, and a reduction in the gate length dimension. Since the current conduction capability of a CMOS integrated circuit device is inversely proportional to both gate oxide thickness and the physical gate length (to the first order) reducing these dimensions has been the design modification of choice in the semiconductor industry. For example, current CMOS integrated circuits have gate oxides which may be on the order of 200 Å or less in thickness. This is in contrast to earlier designs where gate oxide thicknesses of 1,000 Å were typical. Since the breakdown voltage of the gate oxide is proportional to its thickness, increasing at approximately one volt per 10 Å of gate oxide, it will be appreciated that modern CMOS gate oxides are subject to breakdown at significantly lower voltages than earlier ICs, for example, 20 volts or less. Thus, shorting of the buffer FETs through degradation of the gate oxide during an ESD event may occur at relatively low voltages. The damage caused by this type of ESD discharge is often quite serious since the gate oxide will generally be permanently degraded by such ESD breakdown of the oxide.

The reduced physical dimensions in an active transistor, also give rise to a phenomenon known as "hot electron" injection; where high electric fields promote the dissociation of electron/hole pairs and the tunneling of energetic electrons into the gate oxide. The presence of these electrons in the gate oxide creates a fixed charge which further modifies the electric field in the channel region of the CMOS device, resulting in a higher conductivity at a given stimulus on the gate electrode. This change in the conductivity parameter is cumulative and can result in unreliable device parameters. This "hot electron" injection mechanism is also inversely proportional to the thickness of the oxide underneath the gate electrode and the length of the conductive channel underneath the gate electrode. Subsequent events will tend to follow the same discharge path through the weakened gate oxide and such current "lock-on" onto the weakened gate oxide will ultimately destroy the buffer FET. Gate oxides weakened by reverse bias breakdown stress are especially susceptible to hot carrier injection at the point of weakness. Hot carrier injection is able to induce a weakness in the gate oxide by itself, through joule heating of the oxide by increased current flowing in the channel area directly underneath the oxide. Weakening of the oxide, allowing enhanced hot carrier injection, resulting in increased current flow below the point of weakness, further weakening the oxide, results in ever increasing current in a run-away effect, which eventually destroys the device. Various other factors have also contributed to the increased susceptibility of modern VLSI integrated circuits and in particular CMOS integrated circuits to ESD damage. The aforementioned problems resulting from reduced device dimensions become particularly significant for gate oxide thicknesses less than approximately 275 Å and channel lengths less than approximately 2 microns. Further increases in CMOS integrated circuit performance, i.e., increased current drive capability, through reduction of the gate oxide thickness and reduction of the gate length dimension, will result in increased susceptibility to the problems of low breakdown voltages and hot carrier injection. These problems must be solved before further advances in increasing device performance through reducing device dimensions may be practically accomplished.

The most common approach to overcoming the aforementioned problems in protecting modern VLSI integrated circuits against ESD damage has been to increase the resistance of the resistor placed in series between the pad and the buffer circuit. Since this increases the load driven by the buffer circuit, however, this approach will be unacceptable for a great many applications. For example, in an output buffer circuit required to drive a relatively high current load through the output pad, such a high resistor in series with the output pad will be unacceptable. Various other applications, such as applications requiring fast response times, will similarly not be compatible with a high resistance in series with the pad.

An alternate approach has been to employ a thick oxide device as a parallel discharge path in the input/output buffer circuit. This approach is illustrated in FIG. 2. As shown schematically in FIG. 2, the thick oxide device is a field effect transistor having the gate tied to the input from the pad. The oxide thickness is chosen to provide a threshold voltage for the device such that the device turns on at a desired ESD protection voltage, for example, 30 volts. Thus, when an ESD pulse is applied to the pad, the thick oxide FET will rapidly turn on when the voltage rises above the threshold voltage thereby providing channel conduction and an alternate current discharge path for the ESD pulse. An opposite conductivity type field effect transistor may also be provided which turns on for ESD pulses of the opposite polarity. Also, as indicated in FIG. 2 the thick oxide FET may be combined with a diffusion or polysilicon resistor to provide additional protection against ESD pulses.

As noted above, however, the thin gate oxides of modern CMOS devices are susceptible to relatively low voltage ESD pulses and may break down before the thick oxide FET turns on. Such lower voltage pulses are thus a significant problem. Making the oxide thinner and lowering the threshold voltage of the thick oxide device will not provide a suitable solution since this then subjects that device to degradation of its gate oxide in response to ESD pulses. Therefore, this device may ultimately fail removing the protection to the circuit and possibly even shorting the circuit. The use of resistors noted above, also has inherent limitations due to the disadvantages of placing a high resistance in series with the buffer circuit pad.

Accordingly, a need presently exists for an improved integrated circuit design which provides increased resistance to ESD pulses.

SUMMARY OF THE INVENTION

The present invention provides an electrostatic discharge (ESD) protection circuit for integrated circuits which provides extremely effective ESD protection for onchip semiconductor devices over a wide range of ESD pulse voltages and which is itself resistant to damage during such ESD pulses.

The present invention provides an ESD protection circuit employing a field effect transistor (FET) having a number of discrete, parallel connected FET segments, coupled between the integrated circuit semiconductor devices and the input/output pad to buffer the semiconductor devices from ESD events on the pad. An extended resistive structure is formed in the same substrate as the buffer FET and extends adjacent the segments of the buffer FET. In the case of an n channel segmented buffer FET, the extended resistive structure is preferably formed by an elongated n well region adjacent the drain of the n channel FET segments and extending the full width of the segmented buffer FET. The extended n well resistor is in turn electrically connected to the integrated circuit pad through an n+ contact diffusion which also serves as the drain contact. The ESD protection circuit of the present invention further includes a shunt device, coupled so as to provide a parallel discharge path for ESD pulses to prevent damage to the segmented buffer FET.

In a preferred embodiment, each of the discrete FET segments will have a separate drain and source diffusion and a separate gate structure but common drain, source and gate contacts to allow the FET segments to function together as a single high current capacity FET. The extended n well resistor is preferably integrally formed with the plural n+ drain diffusions of the FET segments, with a single n well extending adjacent to several neighboring FET segments. The n well resistor may optionally be recessed or notched at the gap between segments. The notch of the n well may be narrower than the gap between the FET segments or wider than the gap between the FET segments, with the latter providing slightly enhanced current crowding during an ESD event. Alternatively, a separate resistive structure may be provided for each FET segment, integrally formed with the n+ drain diffusions of the corresponding FET segment.

In a preferred embodiment, the shunt device is a thick oxide "snap-back" device. The thick oxide snap-back device is a gateless field effect transistor structure employing a thick oxide over the channel region thereof. Since there is no gate, conduction through the device is initiated by avalanche breakdown rather than channel turn-on as in a conventional field effect transistor. In response to an ESD pulse, avalanche breakdown triggers the snap-back device into a lower voltage mode characterized by a "snap-back" in the current versus voltage profile of the device. This voltage snap-back thus provides a parallel path for the ESD pulse with relatively low power dissipation. The thick oxide provides an insulation for hot carriers introduced into the channel of the snap-back device during the avalanche breakdown and snap-back conduction mode thereby preventing destruction of the oxide and shorting through to adjacent layers of metallization after even repeated ESD pulses through the snap-back device.

The combination of the segmented buffer FET, extended resistive structure and thick oxide current shunt device provides extremely effective resistance to ESD pulses through a very wide voltage range.

More specifically, since the extended resistive structure provides an extended current path it has a very low resistance during normal operation of the circuit. This allows the present invention to be readily employed even in high current output driver applications or other applications where a high resistance in the buffer circuit cannot be tolerated. During the occurrence of an ESD event, however, the field effect buffer transistor will tend to break down at a single point in one of the discrete FET segments. Current flow from the ESD pulse will thus flow from the pad through the resistive structure toward the point of breakdown in a funnel-shaped manner, confining the highest current density to a very small area of the resistive structure. This results in an effective resistance during the ESD event which is very much greater than during normal operation. This effectively limits current during the ESD pulse, allowing the shunt device to turn on and shunt the ESD current away. Damage to the field effect buffer transistor, and in particular to the gate oxide of the buffer transistor, is thus effectively eliminated without introducing a significant load into the circuit.

Further features and advantages of the present invention will be appreciated from the following detailed description of the invention.

DETAILED DESCRIPTION OF THE INVENTION

Figure 1:
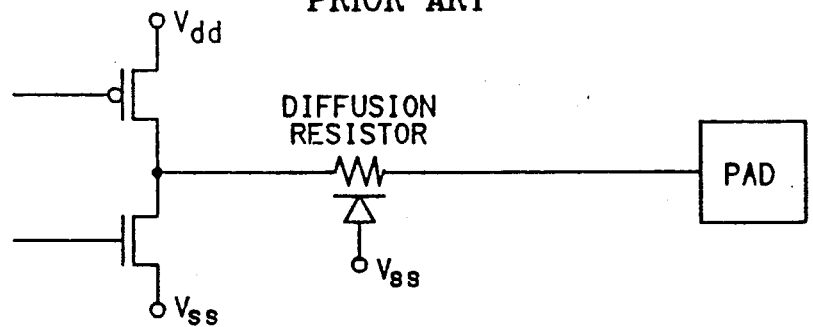
FIG. 1 is an electrical schematic drawing of a prior art electrostatic discharge protection circuit.
Figure 2:
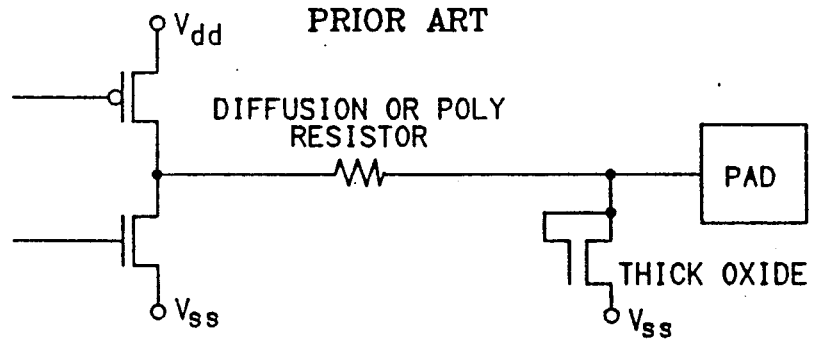
FIG. 2 is an electrical schematic drawing of an alternate prior art electrostatic discharge protection circuit.
Figure 3:
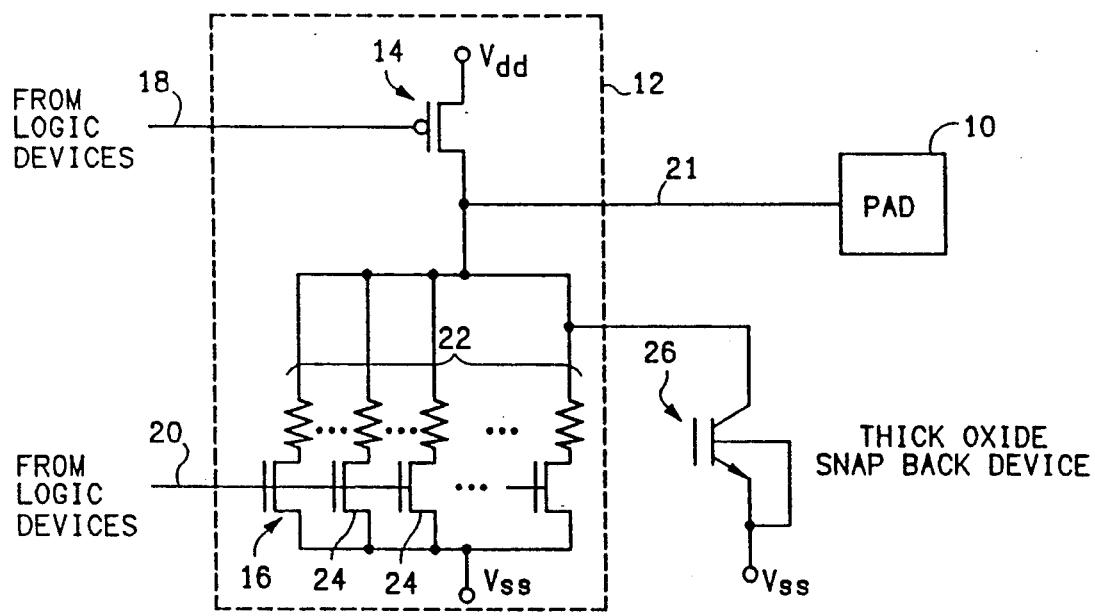
FIG. 3 is an electrical schematic drawing of the electrostatic discharge protection circuit of the present invention.

Referring to FIG. 3, the electrostatic discharge (ESD) protection circuit of the present invention is illustrated in an electrical schematic drawing. In a preferred embodiment, the ESD protection circuit is integrated with an output buffer circuit forming part of a VLSI integrated circuit chip. The integrated circuit chip will typically have a number of electrical contact pads for both input and output electrical connections with external devices. Each pad and associated buffer circuitry will typically require some type of ESD protection circuitry. For convenience, however, the present invention is illustrated in FIG. 3 for a single output pad 10.

As shown in FIG. 3, the semiconductor devices on the integrated circuit chip are electrically buffered from the output pad 10 by means of a buffer circuit 12. In CMOS integrated circuit applications, the buffer circuit 12 may typically take the form of a CMOS inverter gate employing a p channel field effect transistor (FET) 14 and an n channel FET 16 coupled between a first reference voltage $V_{dd}$ and a second reference $V_{ss}$. The inverter formed by p FET 14 and n FET 16 thus buffers the signals applied from the CMOS logic devices (not shown) provided along lines 18, 20, respectively, and provides them to output pad 10 along line 21. In general, it will be appreciated that the buffer circuit 12 may take a variety of different forms depending upon the specific integrated circuit, the specific application drive requirements for output pad 10, as well as the environment in which the integrated circuit chip is intended to be used and hence the susceptibility to ESD pulses and power surges. For example, in certain applications the possibility exists of electrical connection of the pad 10 to relatively high voltage positive rails present in the application environment of the integrated circuit chip. In this type of application, the presence of p diffusions directly coupled to pad 10 must be avoided to prevent the possibility of direct current path being formed through such diffusion into the substrate of the integrated circuit thereby providing a short circuit from the high voltage power rail. In this case, the buffer circuit 12 will employ only an n channel device such as an n FET 16 illustrated in FIG. 3. Other applications may introduce other limitations and design considerations on the buffer circuitry. Additionally, it will be appreciated that the present invention is not limited to CMOS integrated circuits but also is applicable to n MOS, p MOS, bipolar and bi-MOS integrated circuits as well as integrated circuit structure employing GaAs and other well known semiconductor materials.

As illustrated schematically in FIG. 3, the buffer n FET 16, employed in the buffer circuit 12 is composed of a number of discrete FET segments 24. The discrete FET segments 24 will preferably have separate drain and source diffusions and separate gate structures which are electrically coupled together in a parallel configuration such that the FET segments 24 function together as a single FET. As will be discussed in more detail below, this segmented buffer FET structure provides several significant advantages. In particular, a significant increase in resistance to damage from large ESD voltage pulses has been experimentally confirmed for FET segments having a width dimension in a direction perpendicular to current flow of about $21\mu$ or less. An additional advantage is the increased ability to configure a buffer FET 16 having a large total width on the chip.

As further illustrated in FIG. 3, an extended resistive structure 22 is connected in series between the input-/output pad 10 and the segmented buffer FET 16. Although the extended resistive structure is illustrated schematically in FIG. 3 as a plurality of discrete resistors, the resistive structure may be implemented as a single structure extending adjacent all the individual FET segments 24. For example, in a preferred embodiment, resistive structure 22 may be an elongated n well diffusion extending adjacent the FET segments 24. The extended resistive structure 22 thus provides a resistive path extending the full width of the n channel field effect transistor 16. The extended nature of the two-dimensional resistive path illustrated schematically in FIG. 3 gives rise to a bimodal resistance characteristic.

More specifically, the combination of all the FET segments and the extended resistive structure 22 provides a wide current path for current flow through the buffer FET 16, thus it has a low resistance during normal operation of the circuit, which is highly desirable for applications requiring high output current. During the occurrence of an ESD event, the n channel field effect transistor will tend to break down at a single point in a single FET segment. Current flow from the ESD pulse will thus flow from the pad through the extended resistor 22 toward the point of breakdown in a funnel shaped manner. Due to the segmentation of the FETs, the current is confined to a very small area. This results in an effective resistance for the ESD mode of conduction which is as much as two thousand times greater than during normal operation. This effectively limits current during ESD pulses. This focusing of the current in a single FET segment via extended resistor 22 is discussed in more detail below in relation to FIGS. 7(a) and 7(b).

As further illustrated in FIG. 3, the ESD protection circuitry of the present invention preferably also includes an ESD current shunt device 26 to provide an additional path parallel to $V_{ss}$ for the ESD current and hence further protection for the integrated circuit against ESD pulses. In a preferred embodiment, current shunt device 26 is fabricated as a thick oxide "snap-back" device. The characteristics of the snap-back device are such that for sufficiently high voltage pulses applied to pad 10, the snap-back device 26 will turn on quite rapidly and provide a low resistance path for the ESD current which will shunt substantially all the ESD pulse to $V_{ss}$ and prevent damage to the buffer FET 16. The snap-back device 26 employs a gateless field effect transistor structure with a thick oxide region formed over the channel in place of a gate oxide. Since the snap-back device 26 does not have a gate structure, the device is turned on by avalanche breakdown cross the drain/channel junction rather than by channel turn-on.

Figure 4:
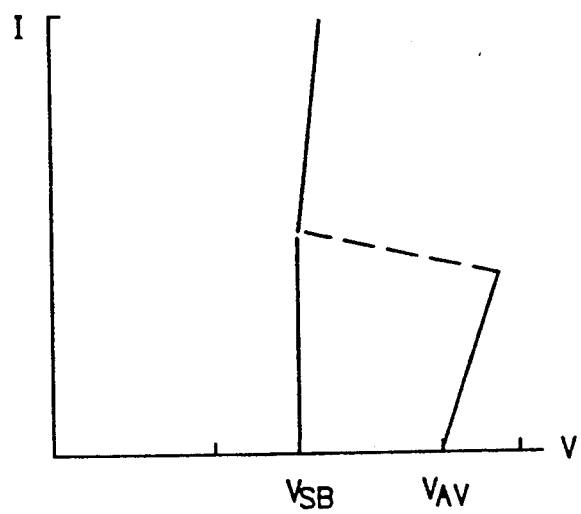
FIG. 4 is a drawing of the current/voltage characteristics of a snap-back current shunt device employed in the electrostatic discharge protection circuit of the present invention.

The current/voltage characteristics of the device 26 after turn on, are illustrated in FIG. 4. The illustrated current/voltage characteristics give rise to the name "snap-back" for the device due to the characteristic shape of the current vs. voltage curve. As may be seen from inspection of FIG. 4, the snap-back device 26 begins to turn on once the voltage applied to the drain thereof reaches the avalanche voltage $V_{AV}$ of the drain/channel junction of the device. Once the snap-back device 26 turns on through avalanche breakdown, the voltage will rapidly "snap back" through a negative resistance regime (indicated by a dashed line) to a second substantially lower voltage $V_{SB}$. This snap-back effect is believed to be due to the tendency of the channel/source junction to become forward biased by the avalanche current injected into the channel region of the device which in turn injects additional current into the channel region. Due to the high electric field, the new current injected into the channel region will be swept to the drain and there, through impact ionization, will cause further electron hole pair creation and further multiplication of current. This rapid multiplication of carriers in the region adjacent the drain causes the voltage across the device to drop rapidly to the lower snap-back voltage $V_{SB}$ and the second part of the current voltage curve illustrated in FIG. 5.

Figure 5:
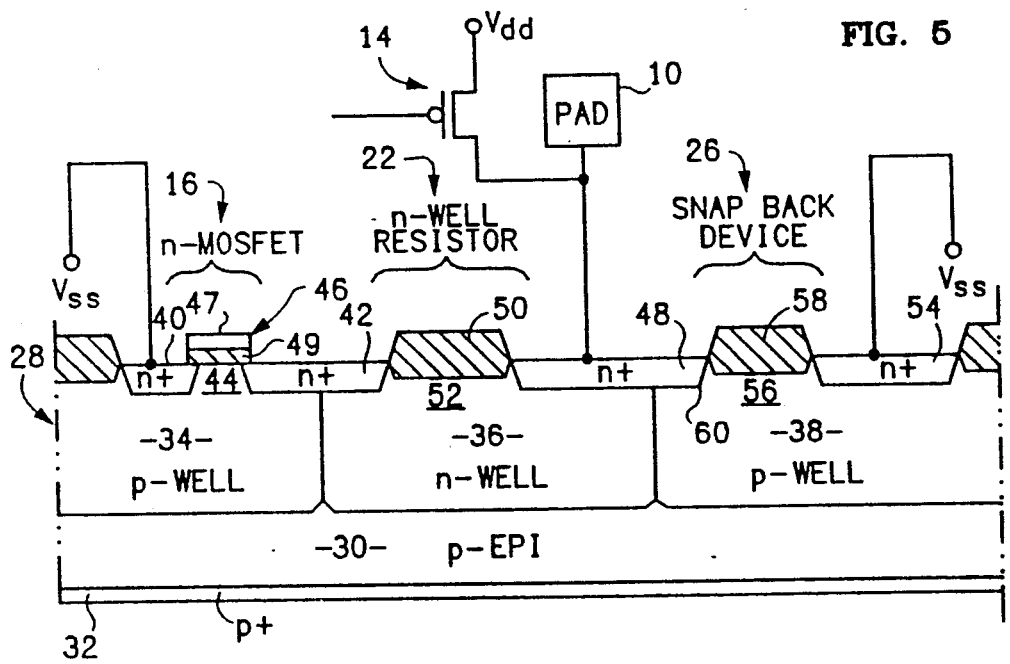
FIG. 5 is a cross-sectional drawing of the electrostatic discharge protection circuit of the present invention implemented as part of a CMOS integrated circuit.

As will be appreciated from FIG. 5, the snap-back portion of the operating range of the snap-back device, being at a substantially lower voltage than the voltage at which the device breaks down, will result in significantly reduced power generation from the ESD pulse than would otherwise be the case. This has significant advantages in reducing damage to the snap-back device 26 itself and to the remainder of the circuit adjacent the snap-back device due to power generated from the ESD pulse.

Although the snap-back device 26 is illustrated in FIG. 3 as spaced apart from buffer FET 16, ESD protection may be increased by closing the proximity of the snap-back device and the n MOSFET output buffer. For example, the proximity may be closed to an extent that the collector terminal of the snap-back device is actually the same diffusion as the drain of the n MOSFET, i.e., the snap-back device is "integrated" with the n MOSFET output buffer.

It will be appreciated from the foregoing that the combination of the segmented buffer FETs 24, the extended resistive structure 22 having a bimodal resistance characteristic, and the thick oxide snap-back device 26 provides extremely effective ESD protection for a wide range of ESD voltage pulses. Typically, at any voltage above 16 v the n channel FET 16 will enter avalanche and begin breakdown conduction prior to the snap-back device 26. Unless the voltage at the pad is clamped instantly, the snap-back device 26 will eventually turn on and snap back to a low resistance conduction mode. When it does, it will shunt the rest of the ESD current to $V_{SS}$. Since the breakdown will typically occur at a single point along the wide segmented buffer FET 16, the resistive structure 22 presents a very high resistance due to the current crowding effect discussed above as current is channeled toward the breakdown point. This high resistance mode of resistive structure 22, thereby severely limits the current of the pulse through the segmented buffer FET 16 and damage due to the pulse is greatly minimized. As a result, permanent damage to the gate oxide of the buffer FET 16 is effectively eliminated and the ESD protection circuit provides effective protection even after repeated ESD pulses.

Referring to FIG. 5, the present invention is illustrated implemented in a CMOS integrated circuit. As shown in FIG. 5, the CMOS integrated circuit includes a substrate 28 having a p− epitaxial layer 30 formed in a higher doped p type body portion 32 of the substrate 28. It will be appreciated that in FIG. 5, the relative depths and lengths of the regions are not shown to scale for space considerations. For example, the p type body portion 32 will in general be substantially thicker than the epitaxial layer 30. For example, for a typical CMOS process the body portion 32 may be 500–600 microns deep, with epitaxial layer approximately 10–20 microns deep.

The p type body portion 32 will typically be coupled to $V_{SS}$, for example through a p+ diffusion (not shown). The portion of the integrated circuit illustrated in FIG. 5, also includes a p well 34, n well 36 and a second p well 38 formed in the p− epitaxial layer 30. The n and p well regions of the CMOS integrated circuit of FIG. 5 may be implemented using a conventional twin tub process. These n and p well regions 34, 36 and 38, may for example have a depth of approximately 4–5 microns. N channel MOS FET 16 is formed in p well 34, having an n+ source diffusion 40, n+ drain diffusion 42 and a channel region 44 formed by the portion of p well 34 between source and drain regions 40, 42, respectively. The n+ source and drain regions 40, 42 may be, for example, 0.3–0.4 microns deep with doping levels of $10^{19}$ as atoms/cc.

Referring to FIG. 5, channel region 44 is covered with a conventional gate structure 46 illustrated schematically in FIG. 5, having a gate 49 preferably of $SiO_2$. The gate oxide 49 which is of approximately 200 Å thickness or less, is subject to the most severe damage in ESD events. As shown in FIG. 5, segmented buffer FET 16 has its n+ drain diffusion 42 extending laterally into adjacent n well 36. It will be appreciated that due to diffusion of dopants, the boundary between p well 34 and n well 36 is not sharp as illustrated schematically in FIG. 5. Hence, the length of n+region 42 required to extend across the boundary from p well 34 to n well 36 will vary with the specific process employed. Additionally, a second n+ diffusion 48 is formed in n well 36, spaced apart laterally from n+ region 42. The drain electrical contact is not made at n+ drain diffusion 42, but at the second n+ diffusion 48. The electrical connection to pad 10 is illustrated schematically in FIG. 5, but pad 10 will also be formed on substrate 28 and will be electrically coupled to n+ contact region 48 through a metallization layer (not shown). A thick oxide spacer region 50 is formed between n+ regions 42 and 48 to prevent shorting therebetween. A portion of n well 36 between n+regions 42 and 48 thus forms an extended resistive structure 22 which is in series between pad 10 and n channel FET 16 and which is integrally formed with the drain region 42 of n FET 16. The resistance of the resistive structure 22 formed by the n well region 36 will vary with the doping concentration of n well region 36. In a conventional CMOS twin tub process, the doping level of n well 36 will be approximately $10^{15}$ atoms/cc of phosphorus. This will provide a surface resistance through surface region 52 of n well 36 of approximately 550–700 ohms/square. Such a sheet resistance provides a suitable bimodal characteristic for the resistor 22 for many applications. However, it will be appreciated that the effective resistance of resistive structure 22 may be readily varied by increasing or decreasing the doping concentration of n well 36.

Referring to FIG. 5, n+ region 48, which is electrically coupled to contact pad 10, may advantageously also be employed as a drain region for snap-back device 26. To integrate n+ region 48 with the snap-back device 26, n+ region 48 is thus preferably extended into p well 38 as illustrated in FIG. 5. Another n+ region 54 is also formed in p well 38 which is in turn electrically coupled to $V_{SS}$. N+ region 54 thus forms the source region of snap-back device 26. A channel region 56 is formed by the p well region between spaced apart n+ regions 48 and 54. The base/channel region 56 is in turn covered with a thick oxide layer 58 chosen of a thickness sufficient to absorb hot carriers created during the snap-back operation of snap-back device 26. For example, in a preferred embodiment of the present invention, an oxide thickness of 1.87 microns has been found to provide suitable protection during repeated ESD events. The length of channel region 56 may be approximately 2.25 microns to give sufficient spacing between the n+ regions 48 and 54 to prevent shorting. The relative size of n+ regions 48, 54 and channel base region 56 may vary widely with the specific integrated circuit layout requirements of the fabrication process.

It will be appreciated from inspection of FIG. 5 that snap-back device 26 has the basic structure of a field effect transistor but without any gate structure to initiate channel conduction for the device. Accordingly, snap-back device 26 must turn on by virtue of avalanche breakdown of the junction 60 between n+ region 48 and p-type region 56 in response to high voltages applied to pad 10 during an ESD pulse. Breakdown voltage of junction 60 will depend upon the carrier concentration of the respective regions 48 and 56. For typical n+ doping concentrations employing dopant levels of approximately $10^{19}$ atoms/cc typically used in modern CMOS processes, and conventional p well concentrations, the breakdown voltage will be approximately 20 volts. As described above in relation to FIG. 4, after snap-back device 26 is turned on by avalanche breakdown of junction 60, a sequence of events will rapidly occur to snap back the device into a lower voltage mode and hence lower power dissipation. For example, the snap-back voltage $V_{SB}$ illustrated in FIG. 4 may be approximately 10 volts for snap-back device having a breakdown voltage $V_{AV}$ of approximately 18 volts. Thus, a very substantial reduction in power dissipation is provided.

Figure 6:
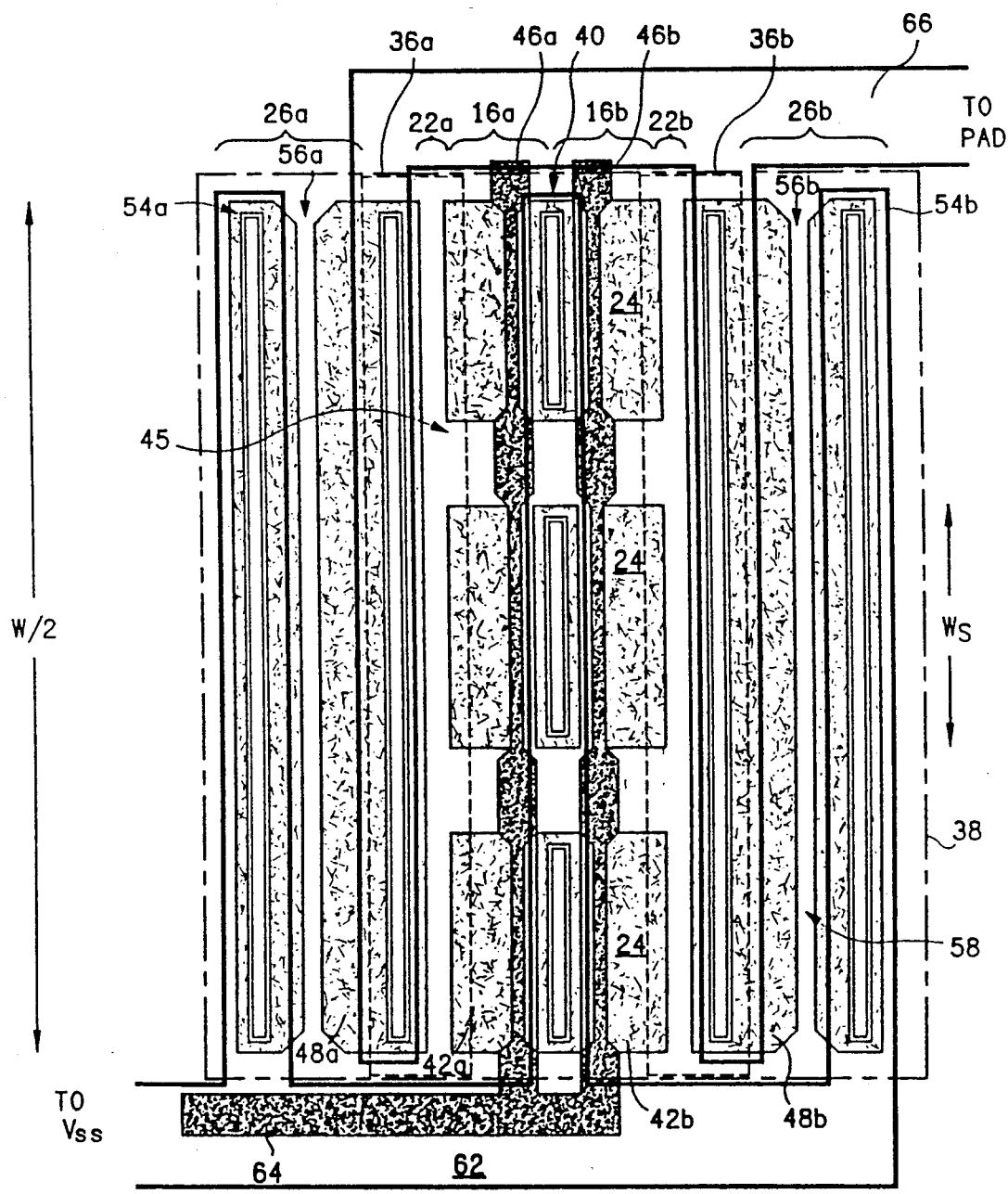
FIG. 6 is a top view of the CMOS integrated circuit implementation of the present invention of FIG. 4, illustrating the discrete FET segments.

Referring to FIG. 6, a top view of the CMOS integrated circuit implementation of FIG. 5 is shown illustrating the segmented structure of buffer FET 16. As may be appreciated from FIG. 6, in a preferred embodiment, the layout of buffer FET 16 is provided in a "folded" shared source configuration which provides a more effective use of chip area. That is, buffer FET 16 is layed out with a first FET 16a and a second "mirror image" FET 16b having a shared source diffusion 40. This provides an effective width W of FET 16 which is double the width taken up on the chip. This configuration will be particularly advantageous in applications requiring wide buffer FETs for relatively high current carrying capability. For the specific configuration illustrated in FIG. 6, FET segments are provided, each having a width $w_s$, giving buffer FET 16 an effective width W of $6w_S$. It should be appreciated, however, that six FET segments 24 are shown for convenience of illustration only and ten or more segments may be preferred for many applications requiring high current capacity. For covenience of comparison with FIG. 5, like numerals are employed with matching "mirror image" structures denoted a, b, respectively.

As may be clearly seen in FIG. 6, the FET segments 24 have separate source diffusions 40, drain diffusions 42a, 42b and gate structures 46a, 46b with spaces 45 between segments. As also illustrated, the discrete FET segments have common contact metallizations 62, 64, 66 for the source, gate and drain contacts, respectively, to provide a parallel electrical connection. As further illustrated in FIG. 6, n well 36a, 36b is provided as elongated "finger shaped" diffusions which extend adjacent the drain diffusions 42 of each FET segment 24. Part of each drain diffusion 42 extends into the n well, as more clearly illustrated in FIG. 5. Additionally, drain contact region 48a, 48b is provided as elongated "finger shaped" n+ diffusions extending adjacent the extended n well 36a, b, and partially overlapping with n well diffusions 36a, b, as shown in FIG. 5. The drain contact metallization 66 has a matching elongated shape to provide the parallel drain contact to each of FET segments 24.

As further illustrated in FIG. 6, snap-back device 26 is preferably integrated with the buffer FET segments 24 as illustrated in FIG. 5, and has a matching elongated structure. More specifically, snap-back device 26a, 26b employs elongated n+ diffusions 48a, b as its drain. The snap-back channel region 56a, b and elongated collector/ source diffusion 54a, b are similarly provided in an elongated "finger shaped" configuration to provide a wide current carrying path for snap-back device 26a, b without requiring significant extra chip area. Alternately, the snap-back device 26 may be positioned away from the segmented buffer FETs rather than integrated therewith for example, where chip layout considerations mitigate against a 5 side by side arrangement.

Figure 7A:
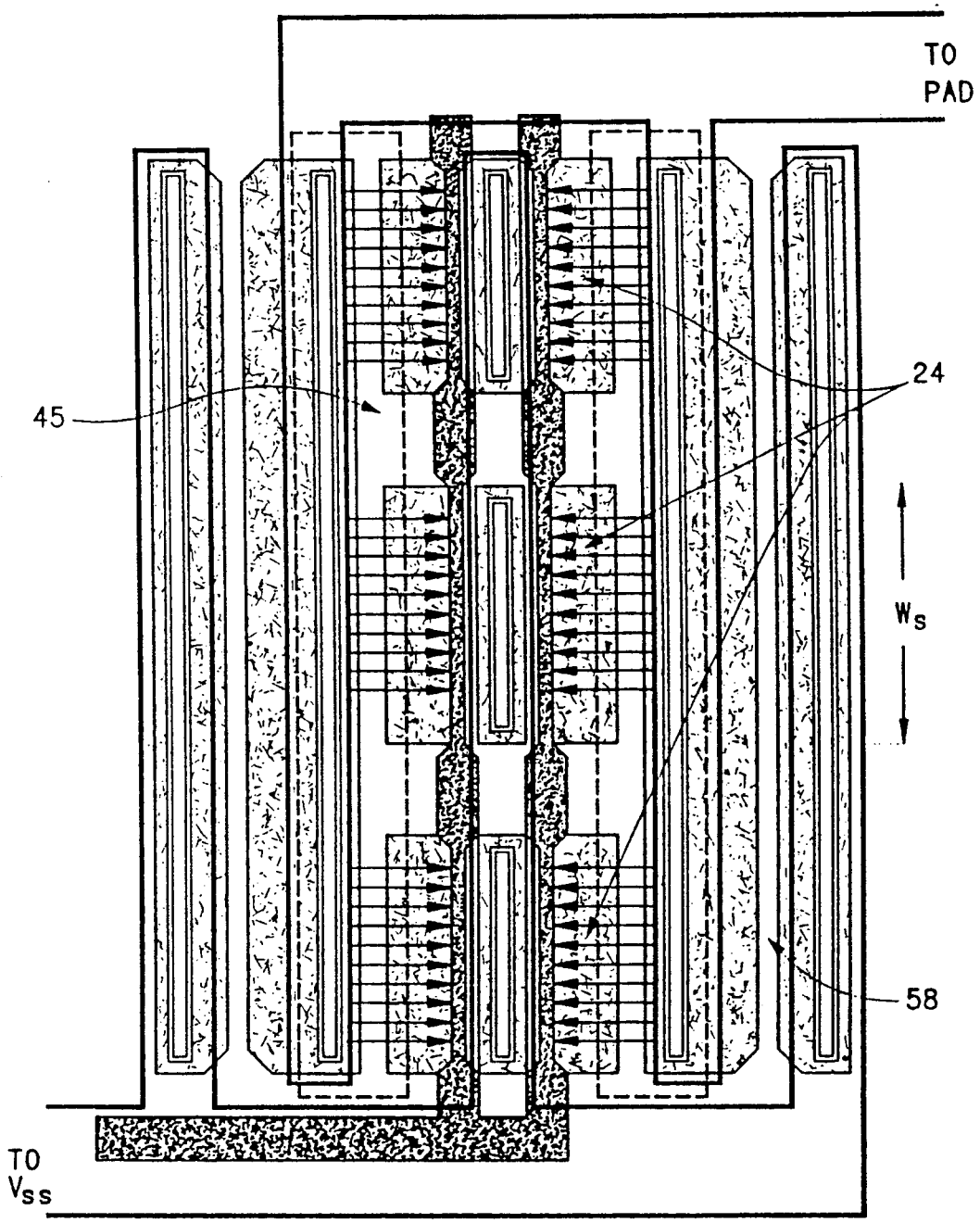
FIG. 7(a) is a top view corresponding to the integrated circuit implementation of FIG. 6 illustrating current flow during normal operation.
Figure 7B:
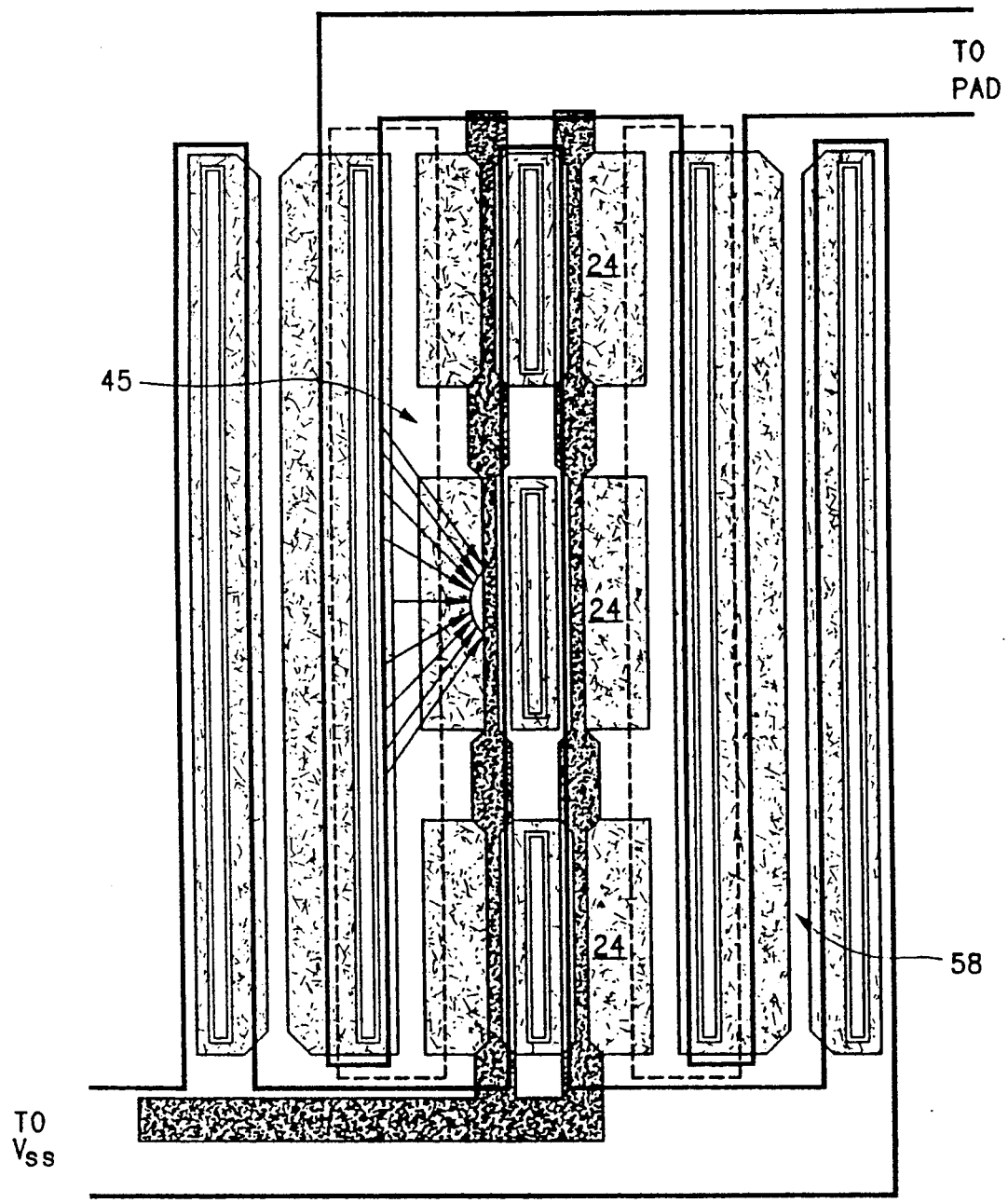
FIG. 7(b) is a top view corresponding to the integrated circuit implementation of FIG. 6 illustrating current flow during an ESD event.

Referring to FIGS. 7(a) and 7(b), current flow through buffer FET 16 is illustrated during normal operation of the integrated circuit and during an ESD event, respectively.

As shown in FIG. 7(a), during normal operation the current flow in the device will be relatively uniform across each segment width $w_S$ in a direction indicated by the arrows. That is, current will flow in parallel through the FET segments from the drain contact n+ region 48a, b through the extended resistive path formed by n well 36a, b to the n+ drain diffusion 42a, b. The current in turn will then flow through the channel region of each segment 24 of buffer FET 16 to source diffusion 40 as in normal flow operation. For a sheet resistance of an n well region 36a, b of approximately 625 ohms/square and a device width W of approximately 200 microns, this results in an effective resistance for the resistor 22 as low as 9 ohms. This provides a relatively negligible load on the buffer circuitry and as a result even high drive currents may be provided by the buffer FET to the output pad 10 coupled thereto.

Referring to FIG. 7(b), current flowing during an ESD event is illustrated. During an ESD event the segmented buffer FET 16 will typically undergo a breakdown, at a specific point 68 along the perimeter of the gate oxide channel region. Since the rest of the device is turned off, the current will be forced to flow in a funnel-shaped path through the breakdown point 68. This "current crowding" is illustrated by the arrows in FIG. 7(b). This current crowding will result in an extremely high effective resistance during ESD events. For example, for the same geometries and doping levels discussed in relation to FIGS. 5 and 6, the effective resistance during such an ESD event will be approximately 90 ohms.

Accordingly, it will be appreciated that the combination of the segmented buffer FET 16 and extended n well resistor provides an increase of 1000% in effective resistance for ESD events over normal device operation. This extremely high effective resistance thus provides a very effective protection for the n channel FET 16 from serious damage during the ESD pulse. Additionally, the high resistance will tend to increase the potential applied to snap-back device 26 causing it to turn-on and shunt the ESD current, even when the buffer FET 16 breaks down first.

Although the width W of the buffer FET will vary with the specific integrated circuit design and application, the individual FET segments preferably will have a width $w_S$ of 21 microns or less. The optimum width of the FET segments has been determined by placing an ESD charge at I/O pins having different width segments coupled thereto, and determining the failure rate. Tests determined that FET with widths of 21 microns ($\mu$) or less provide optimum protection during ESD events. These test results are summarized in Table 1.

TABLE 1

| ESD Test Voltage | Segment Width $W_s$ | | |
|---|---|---|---|
| | 21 $\mu$m | 35 $\mu$m | 42 $\mu$m |
| 300 V | 0 | 0 | 0 |
| 700 V | 0 | 0 | 0 |
| 1200 V | 0 | 0 | 0 |
| 2000 V | 0 | 2 | 8 |
| 2500 V | 0 | 0 | 1 |
| 3200 V | 0 | 0 | 2 |
| 5000 V | 0 | 0 | 0 |
| FAILURE % | 0 | 5 | 43 |

ESD protection may be further increased by enlarging the total width of buffer FET 16. Situations exist, however, which may inhibit compliance with this design consideration. The physical layout size of the buffer may be limited in one direction or another thus preventing the n MOSFET 16 from having wide branches. In this regard, the segmented buffer FET of the present invention allows greater flexibility for configuring a wide FET in the available chip area.

Figure 8:
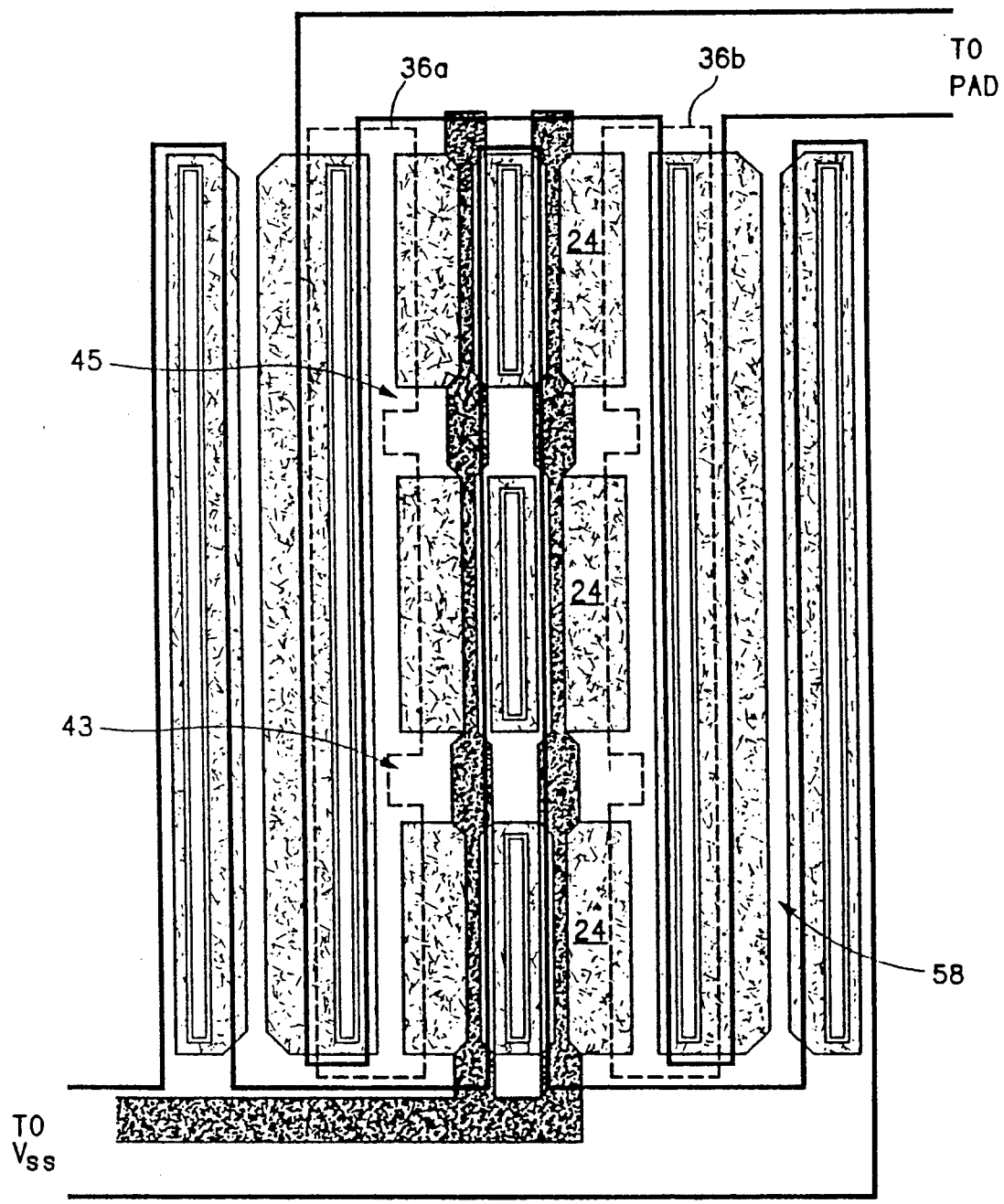
FIG. 8 is a top view of an alternate embodiment of the present invention, implemented in a CMOS integrated circuit, having an n well resistive structure with a notch between the FET segments.

FIG. 8 illustrates an alternate implementation of the present invention with increased ESD protection but with a slightly more complicated layout for the extended n well resistor. As shown in FIG. 8, n well 36a, b extends across neighboring FET segments 24 as in the case of embodiment of FIG. 6. However, n well 36a, b is provided with a notch 43 (when viewed from above) between each FET segment. This notch 43 of the n well 36 is narrower than the gap 45 between FET segments 24. In this design, current flow is reduced to a narrower area due to the reduction in the available path across the portion of n well 36a, b in the gap 45 between FET segments 24. This thus provides improved ESD protection since the degree of resistance change between normal and ESD conduction is determined by the extent the current will tend to crowd in an ESD event.

Figure 9:
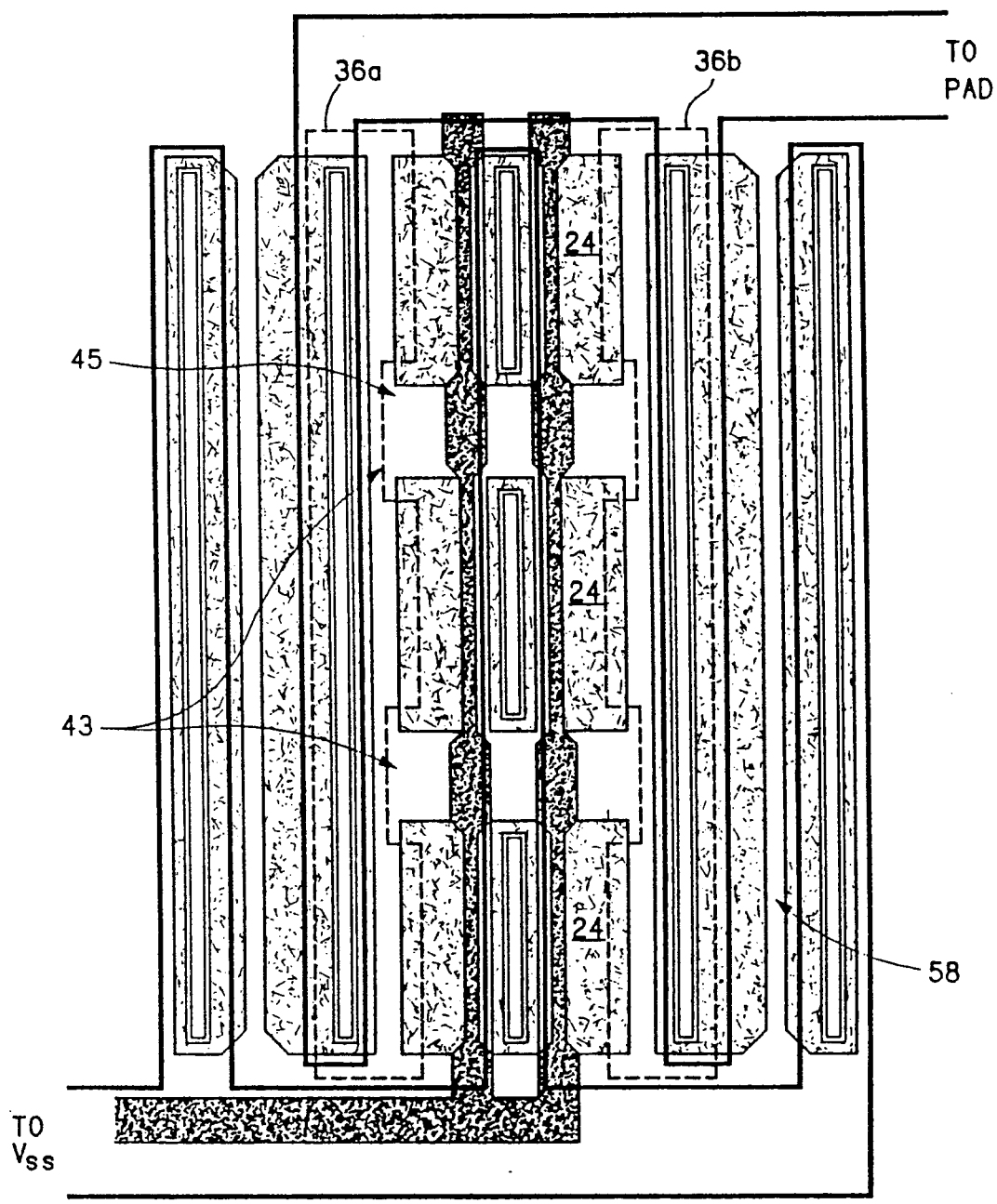
FIG. 9 is a top view of another embodiment of the present invention, implemented in a CMOS integrated circuit, having a notched n well at the gap between the segments with the notch of the n well being wider than the gap between segments.

FIG. 9 illustrates yet another embodiment of the present invention wherein the n well resistor 36a, b is provided with a notch 43 between FET segments 24 which is wider than the gap 45. As a result, the functional width of n well resistor 36a, b is less than the width of the FET segments 24. This thus results in a somewhat reduced current flow area even during normal operation but also results in an even greater limiting of the current flow area during an ESD event, providing improved protection during an ESD event.

Figure 10:
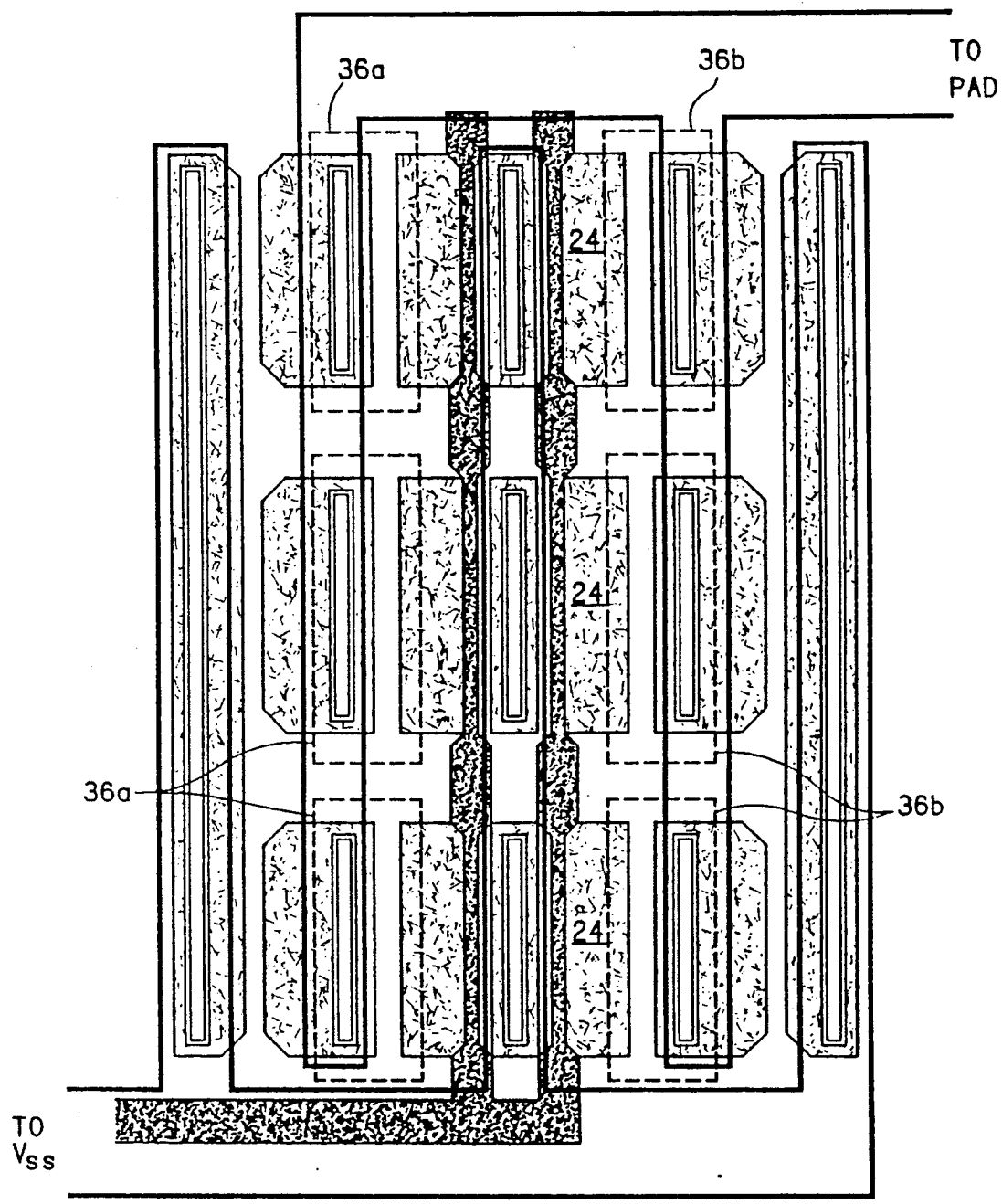
FIG. 10 is a top view of another embodiment of the present invention implemented in a CMOS integrated circuit with the n well resistive structure adjacent the FET segments separated into corresponding discrete n wells.

Another embodiment of the present invention providing even greater ESD protection is illustrated in FIG. 10. As shown in FIG. 10, in addition to the FET segments 24 being completely separated from each other, the n well resistor 36a, b is also separated into discrete segments, with a separate n well segment for each FET segment. Also, separate drain diffusions 48a, b are provided for each segment. This design provides further increased ESD protection since the current flow area is at a minimum during an ESD event confining ESD current exclusively to one of the segments of buffer FET 16.

It will be appreciated by those of ordinary skill in the art that a wide variety of modifications may be made in the above-described embodiment while remaining within the scope of the present invention. For example, while the preferred embodiment of the invention has been described in terms of an implementation in a CMOS integrated circuit, employing twin tub process technology, it will be appreciated that a wide variety of other types of integrated circuit process technologies may advantageously employ the present invention. Additionally, while the present invention has been described as implemented as an integral part of an n channel FET employed in an integrated circuit buffer circuit, it will be appreciated that the present invention may also be implemented with a p channel buffer device. Additionally, it will be appreciated that the present invention is applicable for input as well as output buffers, analog combined input/output buffer circuit, and in a wide variety of specific buffer circuit designs depending on the specific application. A wide variety of additional modifications are also possible to the preferred embodiment of the present invention as described above, while remaining within the scope of the present invention.

What is claimed is:

1. An input/output electrostatic discharge protection circuit for protecting semiconductor devices formed on an integrated circuit chip from transient voltage surges which enter through an input/output electrical contact pad on the chip, comprising:
    a field effect buffer transistor, electrically coupled between the electrical contact pad and the semiconductor devices to be protected and providing a current path between the electrical contact pad and a chip reference potential, comprising a plurality of discrete field effect transistor segments electrically connected in parallel; and
    resistive means, electrically coupled in series between each transistor segment and the electrical contact pad and 15 integrally formed with each field effect transistor segment, for providing an extended resistive path between the electrical contact pad and the transistor segments.

2. An electrostatic discharge protection circuit as set out in claim 1, wherein the total width of the field effect buffer transistor in the direction perpendicular to the direction of current flow is equal to the sum of the widths of the discrete field effect transistor segments.

3. An electrostatic discharge protection circuit as set out in claim 2, wherein the width of each segment is 21 microns or less.

4. An electrostatic discharge protection circuit as set out in claim 3, wherein said buffer transistor comprises 10 segments, each approximately $20\mu$ in width.

5. An electrostatic discharge protection circuit as set out in claim 1, further comprising means, coupled in parallel with said buffer field effect transistor, for shunting current to said reference potential.

6. An electrostatic discharge protection circuit as set out in claim 5, wherein said means for shunting current comprises a thick oxide field effect transistor structure dimensioned so as to operate in a snap back mode upon occurrence of an electrostatic discharge event.

7. An integrated circuit, having improved resistance to electrostatic discharge events, comprising:
    a substrate of semiconductor material having an upper major surface;
    an electrical contact pad formed on the upper major surface of said substrate;
    a field effect transistor structure formed in the upper major surface of the substrate wherein the field effect structure comprises a plurality of transistor segments each having a source, channel and drain formed in the substrate, and a gate structure formed over the channel region, and wherein the field effect transistor segments extend in a direction perpendicular to the direction of current flow between the source and drain;
    a resistive structure formed in said upper major surface of said substrate adjacent to, and integrally coupled with, said discrete transistor segments and extending along the direction perpendicular to current flow; and
    a drain contact diffusion formed in said resistive structure and spaced apart from said drain diffusion and electrically connected to said contact pad.

8. An integrated circuit as set out in claim 7, wherein said discrete transistor segments share common source, gate and drain contact electrodes.

9. An integrated circuit as set out in claim 8, wherein said source, drain and drain contact diffusion are n type highly doped silicon and said channel region is p type doped silicon.

10. An integrated circuit as set out in claim 7, wherein said field effect transistor segments are spaced apart in the direction perpendicular to current flow and wherein said resistive structure is a lightly doped diffusion extending in said direction perpendicular to current flow.

11. An integrated circuit as set out in claim 7, wherein the resistive structure is integrally formed with the drain and extends substantially the full width of the field effect transistor structure, whereby the resistive structure is coupled with each field effect transistor segment.

12. An integrated circuit as set out in claim 7, wherein the resistive structure is integrally formed with the drain region and extends substantially the full width of the field effect transistor structure, whereby the resistive structure is coupled with at least two field effect transistor segments and has a recessed region at a gap between the field effect transistor segments with the recessed region narrower than the gap between the field effect transistor segments.

13. An integrated circuit as set out in claim 7, wherein the resistive structure is integrally formed with the drain region and extends substantially the full width of the field effect transistor structure, whereby the resistive structure is coupled with at least two field effect transistor segments and has a recessed region at a gap between the field effect transistor segments with the recessed region wider than the gap between the field effect transistor segments.

14. An integrated circuit as set out in claim 7, further comprising a current shunt device electrically coupled to the electrical contact pad and in parallel with said field effect transistor.

15. An integrated circuit as set out in claim 14, wherein the current shunt devices comprises a gateless field effect transistor formed in said upper major surface of said substrate adjacent to said resistive structure.

16. An integrated circuit, having improved resistance to electrostatic discharge events, comprising:
- a substrate of semiconductor material having an upper major surface;
- an electrical contact pad formed on the upper major surface of said substrate;
- a field effect transistor structure formed in the upper major surface of the substrate wherein the field effect structure comprises a plurality of transistor segments each having a source, channel and drain formed in the substrate, and a gate structure formed over the channel region, and wherein the field effect transistor segments extend in a direction perpendicular to the direction of current flow between the source and drain;
- a plurality of discrete resistive structures formed in said upper major surface of said substrate adjacent to each field effect transistor segment, wherein each discrete resistive structure is integrally coupled with one field effect transistor segment and has an extended dimension along the direction perpendicular to current flow; and
- a drain contact diffusion formed in each of said resistive structure and spaced apart from said drain diffusion and electrically connected to said contact pad.

17. An integrated circuit as set out in claim 16, further comprising a current shunt device electrically coupled to the electrical contact pad and in parallel with said field effect transistor.

18. An integrated circuit as set out in claim 17, wherein the current shunt devices comprises a gateless field effect transistor formed in said upper major surface of said substrate adjacent to said resistive structure.

* * * * *